United States Patent

Hada

[11] Patent Number: 6,020,764
[45] Date of Patent: Feb. 1, 2000

[54] EMITTER COUPLED LOGIC CIRCUITRY WITH ADDITIONAL DISCHARGE PATH

[75] Inventor: Tetsushi Hada, Tokyo, Japan

[73] Assignees: Mitsubishi Electric Engineering Co., Ltd.; Mitsubishi Denki Kabushiki Kaisha, both of Tokyo, Japan

[21] Appl. No.: 08/873,365

[22] Filed: Jun. 12, 1997

[30] Foreign Application Priority Data

Dec. 27, 1996 [JP] Japan ..................................... 8-350168

[51] Int. Cl.$^7$ ............................................... H03K 19/086
[52] U.S. Cl. ............................. 326/126; 326/89; 326/130
[58] Field of Search ................................. 326/125–127, 326/130, 18, 89

[56] References Cited

U.S. PATENT DOCUMENTS

| | | | |
|---|---|---|---|
| 5,321,321 | 6/1994 | Kurisu | 326/126 |
| 5,514,984 | 5/1996 | Nakamura | 326/126 |
| 5,572,152 | 11/1996 | Ueda | 326/126 |
| 5,754,062 | 5/1998 | Satoh et al. | 326/126 |
| 5,767,702 | 6/1998 | Hense et al. | 326/126 |
| 5,789,946 | 8/1998 | Sawairi | 326/126 |

OTHER PUBLICATIONS

"Motorola MECL Integrated Circuits," Motorola MECL Device Data (from an ECL IC data book of Motorola Co.), Series E, Motorola Inc., 1987, 2 pages.

"SELIC Family Overview," SST ECL Logic IC, NEL NTT Electronics Technology Corporation, Tokyo, Japan, Feb. 1995, 2 pages.

*Primary Examiner*—Jon Santamauro
*Assistant Examiner*—Don Phu Le
*Attorney, Agent, or Firm*—Burns, Doane, Swecker & Mathis, LLP

[57] ABSTRACT

There is provided emitter coupled logic (ECL) circuitry comprising a differential amplifier circuit for receiving an input signal and a reference potential Vbb, and for causing an output circuit to make a transition to its high state by charging a parasitic capacitor which is parasitic in the output circuit, and make a transition to its low state by discharging a charge stored in the parasitic capacitor to a potential Vtt by way of a load resister, according to whether or not the level of the input signal is larger than the reference potential Vbb, and a discharge switching circuit which can switch to its conductive state in response to a control signal applied thereto so that the charge stored in the parasitic capacitor is also discharged to the negative potential Vee by way of the discharge switching circuit.

13 Claims, 7 Drawing Sheets

EMITTER COUPLED LOGIC CIRCUITRY WITH ADDITIONAL DISCHARGE PATH

BACKGROUND OF THE INVENTION

1. Field of the Invention

The present invention relates to emitter coupled logic (ECL) circuitry which is a bipolar digital semiconductor integrated circuit and, more particularly, to a technique for speeding up the ECL circuitry.

2. Description of the Prior Art

Conventionally, ECL circuitry which is categorized as a kind of bipolar digital semiconductor integrated circuitry and, more specifically, as a non-saturation logic circuit, has been used in a central processing unit of a mainframe computer which requires lightning-quick data processing, or in a high-speed instrument, because the ECL circuitry can operate at a higher speed as compared with other logic circuits even though the ECL circuitry consumes a large amount of power. In general, the ECL circuitry has a pair of differential transistors having emitters connected to each other, and it serves as a balanced differential amplifier which can operate according to a current controlled by a constant-current circuit. The ECL circuitry further comprises an output circuit provided with an output terminal, a load resistor connected between the output terminal and an external power supply, and an emitter-follower transistor having its emitter, which is held in an open state, connected to the output terminal. The ECL circuitry is so constructed as to define the level of its output logic signal according to the level of an input logic signal applied thereto, and increase its capability of driving the load of the output circuit.

Referring now to FIG. 7, there is illustrated a schematic circuit diagram of such the prior art ECL circuitry. In the figure, reference numerals 14 and 15 denote a transistor, 10 and 11 denote a resistor, and 8 denotes a constant-current source Io. These components 14, 15, 10, and 11 construct a differential amplifier. Furthermore, reference numeral 1 denotes an input terminal to which a logic signal Vin is applied. The input terminal 1 is connected to the base of the transistor 14. Reference numeral 2 denotes a terminal to which a constant negative reference voltage Vbb is applied. The terminal 2 is connected to the base of the transistor 15, so that the constant negative voltage Vbb can be used as the reference to be compared with the level of the input logic signal Vin. Furthermore, reference numeral 9 denotes a capacitor which is inevitably parasitic in the input circuit of the ECL circuitry, 16 denotes an emitter-follower output transistor for furnishing an output signal to outside the ECL circuitry, 3 denotes an output terminal connected to the emitter of the output transistor 16, and 12 denotes a load resistor connected between the output terminal 3 and a potential Vtt. These components 16, 3, and 12 construct the output circuit of the ECL circuitry. Furthermore, reference numeral 13 denotes a parasitic capacitor which is inevitably parasitic in the output circuit of the ECL circuitry.

As shown in FIG. 7, the collector of the emitter-follower output transistor 16 is connected to a potential Vcc having a value of ground which is equal to the value of a ground potential used in common with external circuits. Typically, the potential Vcc has a value of zero volt, and the potential or level at any point in each unit of the ECL circuitry is determined or measured, referred to the potential Vcc. In addition, the constant-current source 8 is connected to a negative potential Vee at one end thereof. In general, the potential Vee has a value which is lower than that of the potential Vtt.

When an input signal having a voltage which is higher than that of the reference potential Vbb applied to the terminal 2, i.e., a logic signal at high state is applied to the input terminal 1, a current flowing from the collector to the emitter of the transistor 14 is increased while a current flowing from the collector to the emitter of the transistor 15 is decreased. Accordingly, the collector potential of the transistor 15 is increased, and therefore a current flowing from the base to the emitter of the transistor 16 is increased, so that a low-impedance state is caused between the collector and the emitter of the transistor 16. As a result, a charge is injected into the output terminal 3 connected to the emitter of the output transistor 16 and hence the parasitic capacitor 13 which is parasitic in the output circuit becomes charged, so that the output circuit goes into its high state. The charge time required for charging the parasitic capacitor 13 is determined by the electrical characteristics of the output transistor 16. On the other hand, when an input signal having a voltage which is lower than that of the reference potential Vbb applied to the terminal 2, i.e., a logic signal at low state is applied to the input terminal 1, the current flowing from the collector to the emitter of the transistor 14 is decreased while the current flowing from the collector to the emitter of the transistor 15 is increased. Accordingly, the collector potential of the transistor 15 is decreased, and therefore the current flowing from the base to the emitter of the transistor 16 is decreased, so that a high-impedance state is caused between the collector and the emitter of the output transistor 16. As a result, a charge stored in the parasitic capacitor 13 in the output circuit is discharged by way of the load resistor 12, so that the output circuit and hence the output terminal 3 goes into its low state.

In the ECL circuitry shown in the circuit diagram shown in FIG. 7, the output terminal 3 of the output circuit changes to its high state (or low state) when an input signal at high state (or low state) is injected into the ECL circuitry. Thus, the ECL circuitry can serve as a buffer circuit. By contrast, when applying a logic signal to the terminal 2 instead of the input terminal 1 and applying the reference voltage Vbb to the input terminal 1 instead of the terminal 2, the output terminal 3 of the output circuit changes to its low state (or low state) if the input signal injected into the terminal 2 is at high state (or low state). In this case, the ECL circuitry can serve as an inverter. Furthermore, a circuit having a logic function such as an OR gate or NOR gate can be implemented by incorporating at least one other transistor having its collector and its emitter respectively connected in parallel with the collector and emitter of the transistor 14 into the ECL circuitry. That is, the ECL circuitry can be utilized to implement either a buffer or an inverter by using one of the input terminals 1 and 2 as the reference voltage input terminal. Furthermore, the ECL circuitry can be utilized to implement an OR or NOR gate by adding some transistors to the ECL circuitry.

Even though the ECL circuitry is utilized to implement any one of a buffer, an inverter, or an OR or NOR gate, the parasitic capacitor 13 is inevitably added to the output circuit of the ECL circuitry. For a conventional logic circuit equipped with the prior art ECL circuitry, even though the parasitic capacitor 13 is inevitably added to the output circuit of the ECL circuitry, improvements of the electrical characteristics of the output transistor 16 and design of the logic circuit could increase the operational frequency of the logic circuit without having to reduce the fall time of logic signals, because the rise time of logic signals could be reduced due to the improvements. On the other hand, improvements of techniques of micro scale device have improved the performance of semiconductor integrated circuits, so that semiconductor integrated circuits which can operate at high operational frequencies have been used widely. Recently, designs and prototypes of ECL circuitry which can operate at a clock frequency of 2.5 GHz (i.e., a duration of 400 psec) have been provided.

A matter which has been conventionally considered to be normal becomes a problem in developing ECL circuitry which can stably operate at a clock frequency of 2.5 GHz (i.e., a duration of 400 psec). For example, when the output signal of the ECL circuitry is delivered to the input terminal of other ECL circuitry disposed in the same semiconductor integrated circuit and located at the back of the former ECL circuitry, or when the output signal of the ECL circuitry is delivered to the input terminal of other ECL circuitry disposed in another semiconductor integrated circuit which is adjacent to the semiconductor integrated circuit including the former ECL circuitry, the ECL output signal passes through many paths such as metallic-coated wiring lines, bonding pads, bonding wires, package leads, and a pattern of the printed circuit board. The parasitic capacitor 13 shown in FIG. 7 includes parasitic capacitances included in such the paths and input capacitances included in a circuit at the back of the former ECL circuitry, which connects to the output circuit of the ECL circuitry. Furthermore, the parasitic input capacitor 9 shown in FIG. 7 shows that there can exist a parasitic capacitor which is not negligible at the input terminal 1, which depends on the layout or structure of the logic circuit. Typically, the parasitic capacitor 13 has a 2 to 3 pF of capacitance. Furthermore, most of specifications of ECL circuitry define that the load resistor 12 connected between the output circuit and the potential Vtt has a 50Ω to 75Ω of resistance, typically. Since the pattern design of the printed circuit board is built such that the characteristic impedance of the pattern of the circuit board is equal to the resistance value of the load resistor, a change in the design standard of the resistance value of the load resister must be avoided.

When the load resistor 12 has such a defined resistance value, the time constant of the RC circuit including the parasitic capacitor 13 and the load resister 12 is given by the following equation:

time constant=50Ω×2 to 3 pF=100 to 150 psec.

The time constant exerts an influence upon the time period which elapses when the connection between the collector and the emitter of the output transistor 16 makes a transition from its low-impedance state to its high-impedance state, and the time period which elapses when a charge stored in the parasitic capacitor 13 is discharged by way of the load resister 12 and then the output of the output circuit makes a transition from its high state to its low state. This order of the time constant did not give rise a problem for conventional ECL circuitry which operates at low frequencies. However, when the repetition cycle of the clock signal is 400 psec and the duty factor of the clock signal is 50%, since the duration of each clock pulse at high or low state is 200 psec, the time constant of 100 to 150 psec is not small that it may be ignored. Therefore, a measure to reduce the time constant of the output circuit which determines the discharge time as mentioned above as much as possible has been taken in order to increase the margin of the rise time and fall time of the output with respect to the time constant. The reduction in the time constant can be accomplished by reducing the parasitic capacitance and/or the load resistance. The reduction in the parasitic capacitance 13 can be accomplished by miniaturizing components of the ECL circuitry. Since there is a technical limitation to the reduction in the physical size of components of the ECL circuitry, it is not easy to reduce the parasitic capacitance. On the other hand, it is not desirable to reduce the resistance value of the load resistor 12 because it is defined according to the specifications of the ECL circuitry. However, since the time necessary for charging the parasitic capacitor 13 so as to cause the output of the output circuit to make a low to high transition is determined by the electric characteristics of the output transistor 16, the above problem can be solved by reducing the charge time from the viewpoint of the design of the ECL circuitry.

SUMMARY OF THE INVENTION

The present invention is made to overcome the above problem. It is therefore an object of the present invention to provide ECL circuitry which can reduce the time for the output of an output circuit thereof or the input applied to an input circuit thereof to make a transition from its high state to its low state.

In accordance with one aspect of the present invention, there is provided ECL circuitry comprising: an output circuit including an output terminal, an emitter follower transistor having an emitter connected to the output terminal, and a load resistor connected between the output terminal and a potential Vtt; a differential amplifier circuit for receiving an input signal and a reference potential Vbb, and for causing the output circuit to charge a parasitic capacitor which is parasitic in the output circuit so that the output of the output circuit makes a transition to its high state, or discharge a charge stored in the parasitic capacitor to the potential Vtt by way of the load resister so that the output of the output circuit makes a transition to its low state, according to whether or not the level of the input signal is larger than the reference potential Vbb; and a discharge switching circuit having a terminal connected to the output circuit and another terminal connected to a negative potential Vee, which can switch to its conductive state in response to a control signal applied thereto so that the charge stored in the parasitic capacitor is also discharged to the negative potential Vee by way of the discharge switching circuit, as well as to the potential Vtt by way of the load resistor, when the output of the output circuit makes a transition from its high state to its low state.

Preferably, the discharge switching circuit includes a resistor connected to the negative potential Vee, and a third terminal for receiving a threshold potential. The discharge switching circuit can switch to its conductive state according to a difference between the level of the control signal and the threshold potential, so that the charge stored in the parasitic capacitor is also discharged to the negative potential Vee by way of the resistor of the discharge switching circuit.

The discharge switching circuit can include a transistor having a collector connected to the emitter of the emitter-follower transistor, a base for receiving the control signal, and an emitter connected to the resistor and the third terminal of the discharge switching circuit.

In accordance with a preferred embodiment of the present invention, the ECL circuitry further comprises a threshold potential generating circuit connected to a potential Vcc (or Vcc2) and the negative potential Vee, for applying the threshold potential which is between the potential Vcc (or Vcc2) and the negative potential Vee to the third terminal of the discharge switching circuit.

In accordance with another preferred embodiment of the present invention, the ECL circuitry further comprises a level shift circuit for shifting the level of a logic signal applied thereto from inside or outside the ECL circuitry to generate and furnish the control signal to the discharge switching circuit.

In accordance with another aspect of the present invention, there is provided ECL circuitry comprising: an input circuit which can be connected to an output terminal of a signal source located at the front of the ECL circuitry and having a load resistor connected between the output terminal and an potential Vtt, the input circuit including an input terminal; and a discharge switching circuit having a terminal connected to the input circuit and another terminal connected to a negative potential Vee, which can switch to its conductive state in response to a control signal applied thereto so that a charge stored in a parasitic capacitor parasitic at the output terminal of the signal source and a charge stored in a parasitic capacitor parasitic in the input circuit are also discharged to the negative potential Vee by way of the discharge switching circuit, as well as to the potential Vtt by way of the load resistor of the signal source, when an input signal applied to the input terminal of the input circuit makes a transition from its high state to its low state. Preferably, the discharge switching circuit includes a resistor connected to the negative potential Vee, and a third terminal for receiving a threshold potential. The discharge switching circuit can switch to its conductive state according to a difference between the level of the control signal and the threshold potential, so that the charges stored in the parasitic capacitors are also discharged to the negative potential Vee by way of the resistor of the discharge switching circuit.

In accordance with a preferred embodiment of the present invention, the discharge switching circuit includes a transistor having a collector connected to sid input terminal, a base for receiving the control signal, and an emitter connected to the resistor and the third terminal of the discharge switching circuit.

In accordance with another preferred embodiment of the present invention, the ECL circuitry further comprises a threshold potential generating circuit connected to a potential Vcc (or Vcc2) and the negative potential Vee, for applying the threshold potential which is between the potential Vcc (or Vcc2) and the negative potential Vee to the third terminal of the discharge switching circuit.

In either one of the above aspects of the present invention, the threshold potential generating circuit can comprise a series circuit comprised of at least a plurality of diodes biased forward and connected in series with each other, a first terminal connected to the potential Vcc (or Vcc2) and the series circuit, and a second terminal connected to the third terminal of the discharge switching circuit and the series circuit, for applying the threshold potential to the third terminal of the discharge switching circuit. Alternatively, the threshold potential generating circuit can include a series circuit comprised of at least either a plurality of diodes biased forward and connected in series with each other or a plurality of resistors, a first terminal connected to the potential Vcc (or Vcc2) and the series circuit, and a second terminal connected to the negative potential Vee and the series circuit, and a transistor having a base connected to somewhere in the series circuit, an emitter connected to the third terminal of the discharge switching circuit for applying the threshold potential to the third terminal of the discharge switching circuit, and a collector connected to the first terminal. The base of the transistor can be connected to between one resistor and another resistor of the series circuit, or between one resistor and one diode of the series circuit.

Further objects and advantages of the present invention will be apparent from the following description of the preferred embodiments of the invention as illustrated in the accompanying drawings.

DESCRIPTION OF THE PREFERRED EMBODIMENTS

Figure 1:
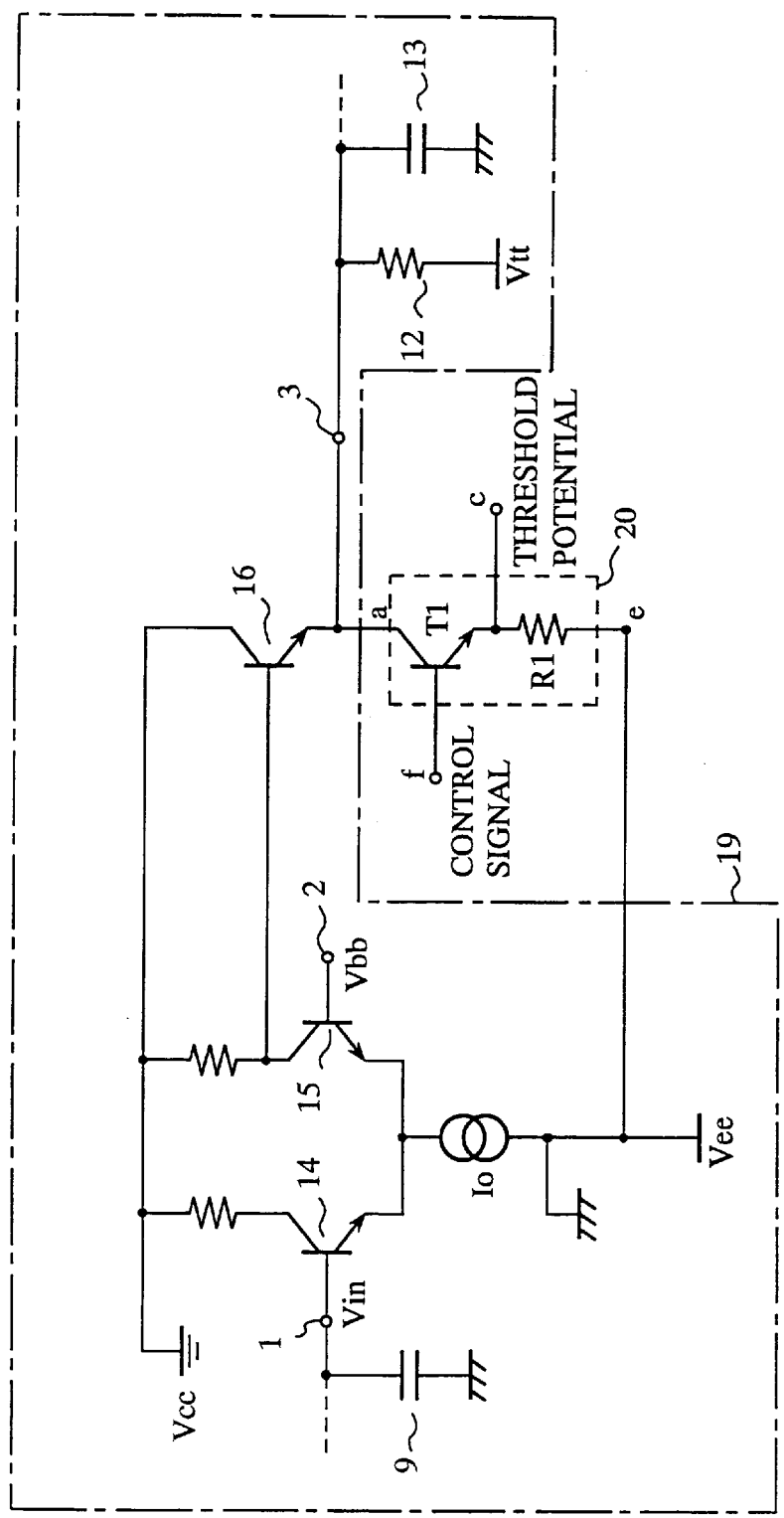
FIG. 1 is a schematic circuit diagram of ECL circuitry according to a first embodiment of the present invention.

Referring now to FIG. 1, there is illustrated a schematic circuit diagram of ECL circuitry according to a first embodiment of the present invention. In FIG. 1, reference numeral 19 denotes a basic unit of the ECL circuitry, 20 denotes a discharge switching circuit, f denotes a terminal to which a control signal is applied to control the discharge switching circuit 20, and a and e denote a terminal of the discharge switching circuit 20. The discharge switching circuit 20 is brought into or out of conduction according to the level of the control signal so that the terminals a and e are electrically connected to each other or the terminal a is disconnected from the terminal e. Reference numeral 3 denotes an output terminal connected to the emitter of an emitter-follower output transistor 16, T1 denotes a transistor, R1 denotes a resistor, and c denotes a third terminal of the discharge switching circuit 20 connected to somewhere in between the emitter of the transistor T1 and the resistor R1, for receiving a threshold potential. In the basic unit 19 of the ECL circuitry, reference numeral 1 denotes an input terminal to which a logic signal is applied, Vee denotes a negative potential, Vtt denotes a potential, and Vcc denotes a potential having a value of ground, for example. Furthermore, reference numeral 9 denotes a capacitor which is parasitic in the input circuit of the ECL circuitry, and 14 and 15 denotes a transistor. The pair of transistors 14 and 15 serve as a balanced differential amplifier. Reference numeral 12 denotes a load resistor which constructs the output circuit of the ECL circuitry in cooperation with the output transistor 16 and the output terminal 3, and 13 denotes a parasitic capacitor which is inevitably parasitic in the output circuit. The terminal a is connected to the output terminal 3 of the output circuit. The terminal e is connected to the negative potential Vee. Alternatively, the terminal e can be connected to the potential Vtt. Since the operation of the basic unit 19 of the ECL circuitry is the same as that of the prior art ECL circuitry mentioned above, the description about the operation of the basic unit will be omitted hereinafter.

When a low-impedance state is established between the collector and the emitter of the output transistor 16 according to a logic signal applied to the input terminal 1, the control signal having a level to bring the transistor T1 out of conduction so that its collector and emitter are disconnected from each other is applied to the terminal f of the discharge switching circuit. As a result, the parasitic capacitor becomes charged, and hence the output of the output circuit is caused to make a transition to its high state and is held in the state. When the level of the logic signal applied to the input terminal 1 is changed and therefore a high-impedance state is established between the collector and the emitter of the output transistor 16, the control signal having a level to bring the discharge switching circuit 20 into conduction so that its terminals a and e are connected to each other is applied to the terminal f of the discharge switching circuit. As a result, the charge stored in the parasitic capacitor 13 is discharged to the potential Vtt by way of the load resistor 12 and to the potential Vee by way of the resistor R1, and hence the output of the output circuit is caused to make a transition to its low state. Thus, discharging the charge in the parasitic capacitor by way of the load resistor 12 and the resistor R1 reduces the discharge time and hence the fall time of the output signal. Accordingly, the operational frequency at which the ECL circuitry operates can be increased.

When the level of the logic signal applied to the input terminal 1 is changed again and therefore a low-impedance state is established between the collector and the emitter of the output transistor 16, the level of the control signal applied to the terminal f of the discharge switching circuit is simultaneously changed such that the discharge switching circuit 20 is brought out of conduction, so that its terminals a and e are disconnected from each other. As a result, the parasitic capacitor becomes charged, and hence the output of the output circuit is caused to make a transition from its low state to its high state. The time necessary for charging the parasitic capacitor is determined by the electrical characteristics of the output transistor 16.

A logic signal from inside or outside a semiconductor integrated circuit including the ECL circuitry of the present invention can be used as the control signal which is to be applied to the terminal f of the discharge switching circuit 20. Furthermore, a threshold potential is applied to the third terminal c connected to somewhere in between the emitter of the transistor T1 and the resistor R1 so that the emitter potential of the transistor T1 can be set to a certain value determined by the threshold potential. As a result, the operating point of the transistor T1 can be finely adjusted or changed.

Accordingly, the above structure of this embodiment offers an advantage in that the transistor T1 can be brought into a further optimum operating point by adjusting the level of the control signal. However, the above structure of this embodiment also increases the power consumption in the resistor R1, because, when a conductive state is established between the collector and the emitter of the transistor T1, a charge stored in the parasitic capacitor 13 is discharged by way of the resistor R1 as well as the load resistor 12, a current flowing from the collector to the emitter of the output transistor 16 in a high-impedance state is passed through the resister R1, and the threshold potential is applied to the terminal c. Accordingly, it is preferable to install a measure to reduce the power consumption in the resistor R1, as will be described below.

Figure 2:
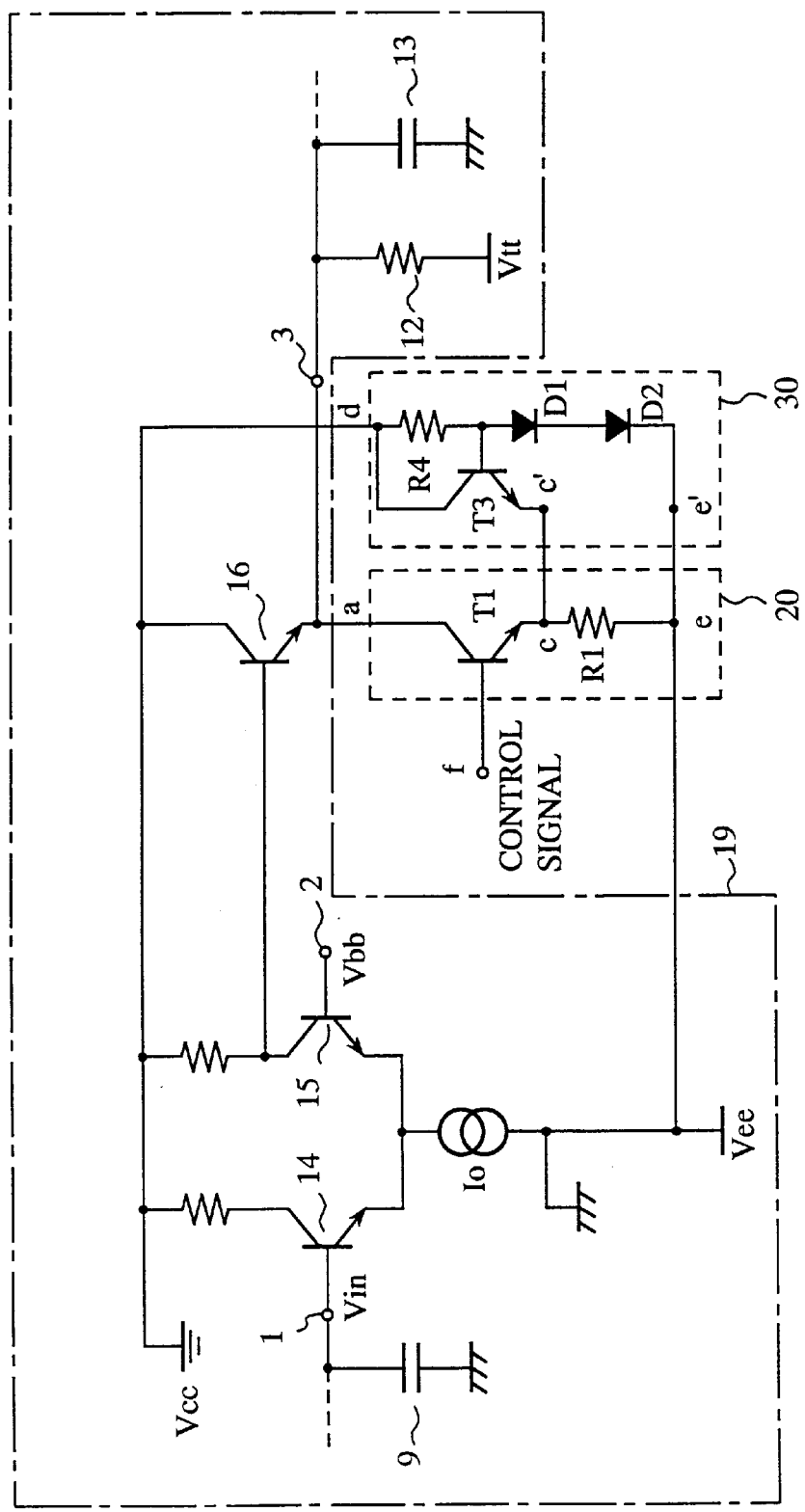
FIG. 2 is a schematic circuit diagram of ECL circuitry according to a second embodiment of the present invention.

Referring next to FIG. 2, there is illustrated a schematic circuit diagram of ECL circuitry of a second embodiment of the present invention. In the figure, the same components as those of the ECL circuitry of the first embodiment are designated by the same reference numerals shown in FIG. 1, and the description about the components will be omitted hereinafter. In FIG. 2, reference numeral 30 denotes a threshold potential generating circuit for generating the threshold potential, d denotes a first terminal of the circuit 30 connected to the potential Vcc, e' denotes a second terminal of the circuit 30 connected to the negative potential Vee, and c' denotes a third terminal of the circuit 30 connected to the terminal c of the discharge switching circuit 20, for furnishing the threshold potential to the terminal c of the discharge switching circuit. The threshold potential generating circuit 30 divides a difference between the potential Vcc and the negative potential Vee to generate and furnish the threshold potential to the discharge switching circuit by way of the terminal c' thereof. As shown in FIG. 2, the terminal c' of the threshold potential generating circuit 30 is electrically connected to the emitter of the transistor T1 of the discharge switching circuit 20 by way of the terminal c.

In the ECL circuitry having the above circuit structure, the operating point of the transistor T1 of the discharge switching circuit 20 can be changed by shifting the emitter potential of the transistor T1. Therefore, a logic signal from a logic circuit located inside or outside a semiconductor integrated circuit including the ECL circuitry of the present invention can be easily used as the control signal which is to be applied to the terminal f of the discharge switching circuit 20. As previously explained, the transistor T1 which constructs the discharge switching circuit 20 can be controlled according to the difference between the threshold potential and the level of the control signal delivered by the logic circuit such that the discharge switching circuit 20 is brought into or out of conduction so that its terminals a and e are connected to each other or they are disconnected from each other.

The terminal a of the discharge switching circuit 20 is connected to the output terminal 3. Thus, the resistor R1 which constructs the discharge switching circuit 20 serves as another discharge path through which a charge stored in the parasitic capacitor 13 is discharged when the transistor T1 remains in its conductive state. Accordingly, the discharge time can be changed by changing the resistance value of the resistor R1.

When a low-impedance state is established between the collector and the emitter of the output transistor 16 according to a logic signal applied to the input terminal 1, the control signal having a level to bring the transistor T1 out of conduction so that its collector and emitter are disconnected from each other is applied to the terminal f of the discharge switching circuit. As a result, the output of the output circuit is caused to make a transition to its high state and is held in the state. When the level of the logic signal applied to the input terminal 1 is changed and then the output transistor 16 changes to a high-impedance state, the control signal having a level to bring the discharge switching circuit 20 into conduction so that its terminals a and e are connected to each other is applied to the terminal f of the discharge switching circuit. As a result, a charge stored in the parasitic capacitor 13 is discharged to the potential Vtt by way of the load resistor 12 and to the potential Vee by way of the resistor R1, and hence the output at the output terminal 3 is caused to make a transition to its low state. Thus, discharging the charge in the parasitic capacitor by way of the load resistor 12 and the resistor R1 reduces the discharge time and hence the fall time of the output signal. Accordingly, the operational frequency at which the ECL circuitry operates can be increased. When the level of the logic signal applied to the input terminal 1 is changed again and therefore the output transistor 16 changes to a low-impedance state, the level of the control applied to the terminal f of the discharge switching circuit is simultaneously changed such that the discharge switching circuit 20 is brought out of conduction, so that its terminals a and e are connected to each other. As a result, the parasitic capacitor 13 becomes charged, and hence the output of the output circuit is caused to make a transition from its low state to its high state. The time necessary for charging the parasitic capacitor is determined by the electrical characteristics of the output transistor 16.

The threshold potential generating circuit 30 shown in the schematic circuit diagram of FIG. 2 is a general constant-voltage circuit which can make the voltage across the resistor R1 constant. As mentioned above, when the output transistor 16 is held in a high-impedance state and the discharge switching circuit 20 is brought into conduction so that its terminals a and e are connected to each other, since a charge stored in the parasitic capacitor 13 is also discharged by way of the resistor R1 as well as the load resistor 12, the current due to the discharge and a current flowing from the collector to the emitter of the output transistor 16 in a high-impedance state are injected into the resistor R1. Therefore, there is a possibility that the voltage across the resistor R1 is increased and hence the power consumption in the resistor R1 is increased. However, even though the above currents are fed through the resistor R1, the transistor T3 of the threshold potential generating circuit 30 automatically prevents its emitter current from flowing therethrough and operates in such a manner that the voltage across the resistor R1 is made constant. Accordingly, the emitter potential of the transistor T1 can be stabilized and hence the operating point of the discharge switching circuit 20 can be stabilized. Thus, this embodiment of the present invention can offer an advantage of being able to easily set the level of the control signal to a predetermined value which depends on the stable and certain threshold potential provided by the threshold potential generating circuit 30.

Figure 3A:
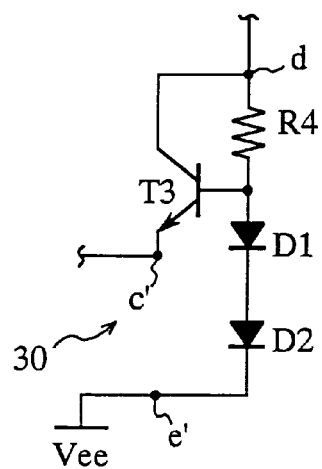
FIGS. 3a to 3e are schematic circuit diagrams of examples of a threshold potential generating circuit according to the present invention.
Figure 3B:
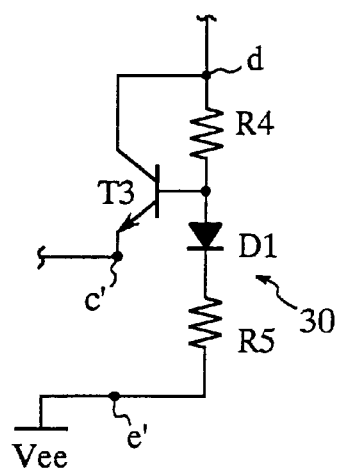
Figure 3C:
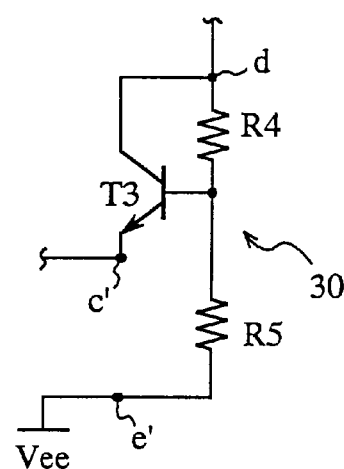
Figure 3D:
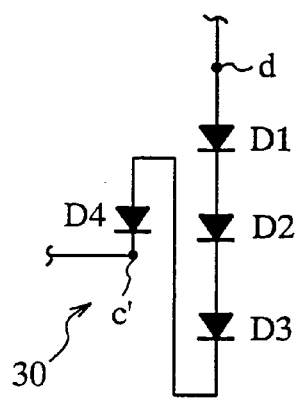
Figure 3E:
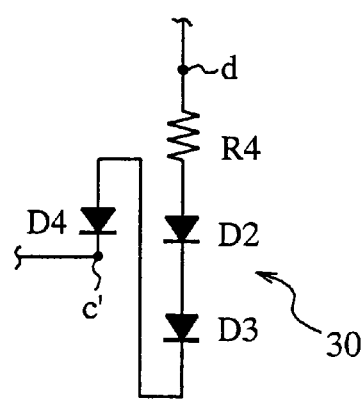

Referring next to FIGS. 3a through 3e, there are illustrated schematic circuit diagrams of examples of the threshold potential generating circuit 30. The example shown in FIG. 3a is the same as the threshold potential generating circuit 30 shown in FIG. 2. This example is provided with the transistor T3 and a series circuit comprised of a resistor R4 and two diodes D1 and D2 forward biased and connected in series with each other. The collector of the transistor T3 is connected to the potential Vcc via the terminal d, and the base of the transistor T3 is connected to somewhere in between the resistor R4 and the diode D1. The emitter of the transistor T3 is connected to the terminal c of the discharge switching circuit 20 by way of the terminal c'. The example shown in FIG. 3b includes another resistor R5 instead of the diode D2 in the series circuit shown in FIG. 3a. The example shown in FIG. 3c includes another resistor R5 instead of the two diodes D1 and D2 in the series circuit shown in FIG. 3a. The threshold potential generating circuit 30 of the example shown in FIG. 3d is comprised of a series circuit including a plurality of diodes D1 to D4 forward biased and connected in series with each other. The threshold potential generating circuit 30 of the example shown in FIG. 3e is comprised of a series circuit including a plurality of diodes D2 to D4 forward biased and connected in series with each other, and a resistor R4 connected to the diode D2.

The examples of the threshold potential generating circuit 30 shown in FIGS. 3b and 3c can offer an advantage of being able to finely change the threshold potential over an extended threshold potential range by changing the resistance values of the resistors R4 and R5 of the series circuit. Similarly, the example of the threshold potential generating circuit 30 shown in FIG. 3e can offer an advantage of being able to finely change the threshold potential over an extended threshold potential range by changing the resistance value of the resistor R4 of the series circuit. Accordingly, it is easy to design the threshold potential generating circuit 30 which can produce an optimum threshold potential for a given level of the control signal provided by a logic circuit located inside or outside the ECL circuitry.

Figure 4:
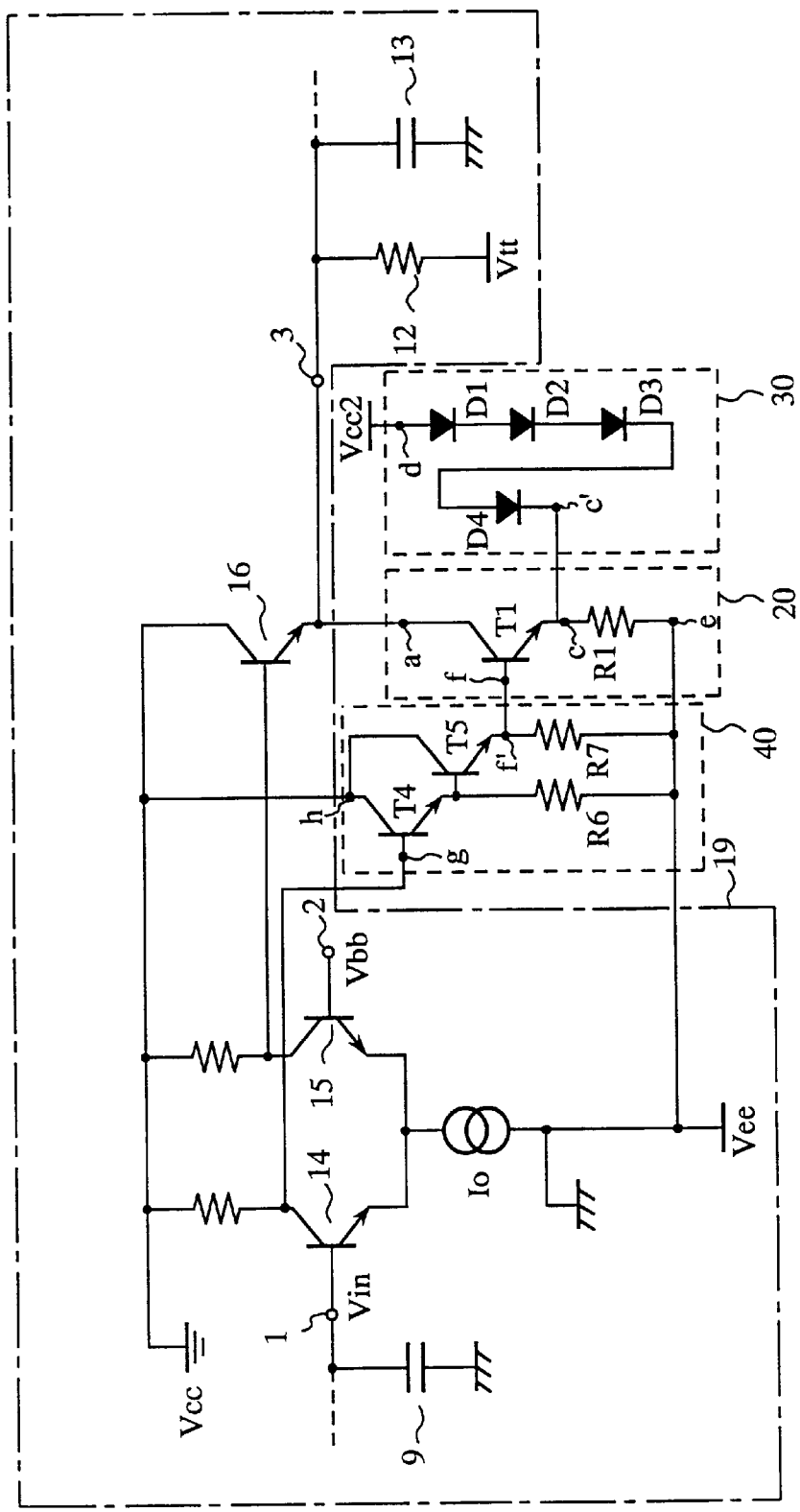
FIG. 4 is a schematic circuit diagram of ECL circuitry according to a third embodiment of the present invention.

Referring next to FIG. 4, there is illustrated a schematic circuit diagram of ECL circuitry of a third embodiment of the present invention. In the figure, the same components as those of the ECL circuitry of the second embodiment mentioned above are designated by the same reference numerals shown in FIG. 2, and the description about the components will be omitted hereinafter. In FIG. 4, reference numeral 40 denotes a level shift circuit, g denotes an input terminal of the level shift circuit 40 connected to the collector of the transistor 14 of the balanced differential amplifier, for receiving a logic signal, and f' denotes an output terminal of the level shift circuit 40.

Furthermore, the level shift circuit 40 is provided with a transistor T4 having its base connected to the input terminal g and its collector connected to the potential Vcc via a terminal h of the level shift circuit 40, another transistor T5 having its base connected to the emitter of the transistor T4 and its collector connected to the potential Vcc via the terminal h, a resistor R6 connected to the emitter of the transistor T4 and the base of the transistor T5 at one end thereof, and connected to the negative potential Vee at the other end thereof, and another resistor R7 connected to the emitter of the transistor T5 and the terminal f' at one end thereof, and connected to the negative potential Vee at the other end thereof. The output terminal f' of the level shift circuit 40 is connected to the input terminal f to which the control signal is applied for controlling the discharge switching circuit 20. Furthermore, the terminal d for supplying power to the threshold potential generating circuit 30 is connected to a potential Vcc2.

The level shift circuit 40 has a function of shifting the level of a logic signal applied to the input terminal g thereof so as to produce the control signal. Thus, the level shift circuit 40 can apply the control signal generated to the control terminal f of the discharge switching circuit 20 by way of the terminal f' thereof so as to bring the discharge switching circuit 20 into or out of conduction so that its terminals a and e are connected to each other or they are disconnected from each other. If the base-emitter forward biased voltage of the transistors T4 and T5 is Vbe, the level shift circuit 40 can reduce the level of a logic signal applied to the terminal g thereof by a voltage of 2Vbe to furnish the control signal having a level which is equal to (the level of the input logic signal−2Vbe) by way of the terminal f' thereof. Thus, the ECL circuitry according to this embodiment can control the discharge switching circuit 20 according the level of a logic signal furnished by the basic unit 19 of the ECL circuitry by means of the level shift circuit 40 and the threshold potential generating circuit 30. Furthermore, since the ECL circuitry according to this embodiment can produce the control signal directly from the basic unit 19 of the ECL circuitry, it is easy to implement the ECL circuitry.

When a logic signal applied to the input terminal 1 makes a transition to its high state in the ECL circuitry shown in FIG. 4, the output transistor 16 goes into a low-impedance state, and the discharge switching circuit 20 is brought out of conduction in response to the control signal from the level shift circuit 40 so that its terminals a and e are disconnected from each other. As a result, the parasitic capacitor becomes charged. When the logic signal applied to the input terminal 1 makes a transition from its high state to its low state, the output transistor 16 goes into a high-impedance state, and the discharge switching circuit 20 is brought into conduction in response to the control signal from the level shift circuit 40 so that its terminals a and e are connected to each other. As a result, a charge stored in the parasitic capacitor 13 is discharged to the potential Vtt by way of the load resistor 12, and to the potential Vee by way of the resistor R1 of the discharge switching circuit 20. Thus, the fall time of the output signal can be reduced.

As shown in FIG. 4, the threshold potential generating circuit 30 of the ECL circuitry of this embodiment can be comprised of a series circuit including a plurality of diodes D1 to D4 forward biased and connected in series with each other. The potential Vcc2 has a value which is equal to or different from the value of the potential Vcc. In general, the number of diodes included in the threshold potential generating circuit 30 and the resistance value of the resistor R1 of the discharge switching circuit 20 are determined according to the value of the potential Vcc2, the power consumption in the resistor R1, a desired reduction in the discharge time of the RC circuit of the output circuit, and so on. Like the aforementioned embodiments, when the discharge switching circuit 20 is brought into conduction so that an electric connection between the terminals a and e thereof is established, a charge stored in the parasitic capacitor 13 is discharged by way of the load resistor 12. In addition, a current passing from the collector to the emitter of the transistor T1 and a current passing from the collector to the emitter of the output transistor 16 in a high-impedance state, together with a current flowing from the diodes D1 to D4 connected in series with the resistor R1, are injected into the resistor R1. As a result, the potential at the terminal c is increased. According to the volt-ampere characteristic of diodes, this increase in the potential at the terminal c can offer an advantage of remarkably decreasing the amount of the current flowing through the diodes D1 to D4 connected in series with each other.

As shown in FIG. 4, the threshold potential generating circuit 30 of this embodiment has the same structure as that shown in FIG. 3d. Like the aforementioned embodiment, the threshold potential generating circuit 30 of this embodiment can have the same structure as any one of the examples as shown in FIGS. 3a to 3e. As previously explained, the examples shown in FIGS. 3b and 3c of the threshold potential generating circuit 30 can offer an advantage of being able to finely change the threshold potential over an extended threshold potential range by selecting the resistance values of the resistors R4 and R5 of the series circuit. Also, the example shown in FIG. 3e of the threshold potential generating circuit 30 can offer an advantage of being able to finely change the threshold potential over an extended threshold potential range by selecting the resistance value of the resistor R4 of the series circuit.

Figure 5A:
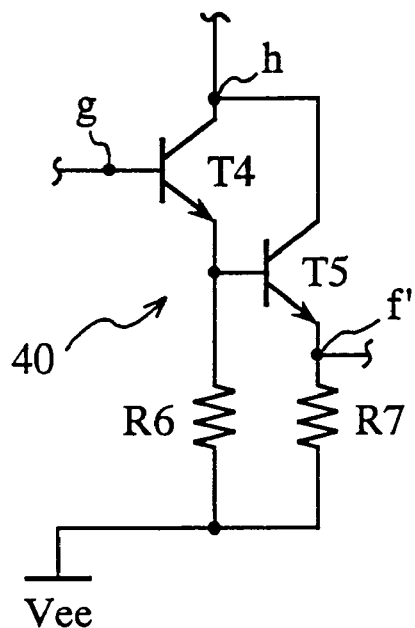
FIGS. 5a to 5c are schematic circuit diagrams of examples of a level shift circuit according to the present invention.
Figure 5B:
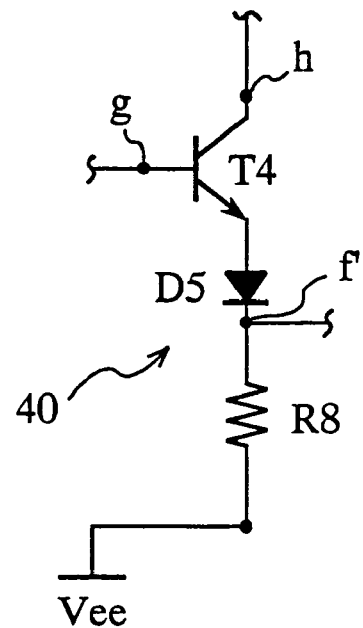
Figure 5C:
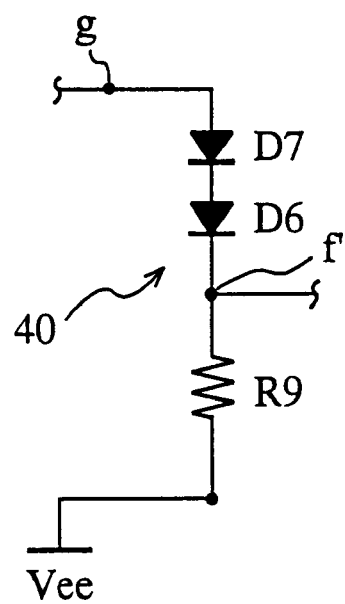
Figure 7:
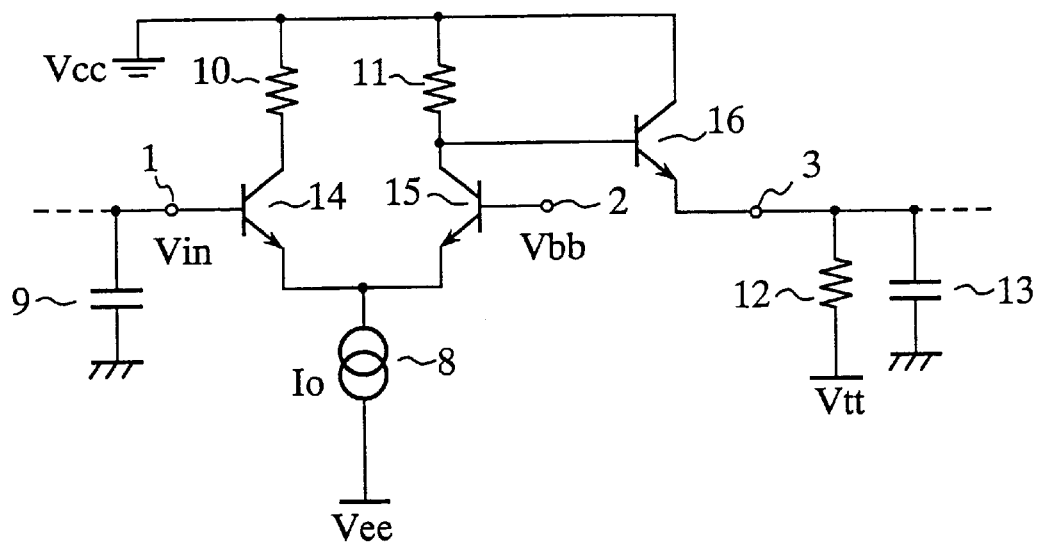
FIG. 7 is a schematic circuit diagram of prior art ECL circuitry.

Referring next to FIGS. 5a to 5c, there are illustrated schematic circuit diagrams each showing the structure of an example of the level shift circuit 40. The example shown in FIG. 5a is the same as the level shift circuit 40 shown in FIG. 4. The example shown in FIG. 5b is provided with a transistor T4, a diode D5 forward biased and connected to the emitter of the transistor T4 at one end thereof and the terminal f at the other end thereof, and a resistor R8 connected to the terminal f and the diode D5 at one thereof, and the potential Vee at the other end thereof. The example shown in FIG. 5c is provided with diodes D6 and D7 forward biased and connected in series with each other, and a resistor R9 connected to the terminal f and the diode D6 at one thereof, and the potential Vee at the other end thereof. The operational speed of each of these examples is determined according to the dimensions and shapes of the transistors T4 and T5, and/or the diodes D5, or D6 and D7. The ECL circuitry according to this embodiment can reduce the fall time of the output signal as compared with the prior art ECL circuitry mentioned above, by controlling the discharge switching circuit 20 using the level shift circuit 40 as shown FIG. 5a, 5b, or 5c, and the threshold potential generating circuit 30 as shown in FIG. 3a, 3b, 3c, 3d, or 3e. Accordingly, the ECL circuitry of this embodiment can operate at a higher speed as compared with the prior art ECL circuitry. For example, in the case where the resistance value of R1=125Ω, the resistance value of the load resistor 12=50Ω, the parasitic capacitance of the capacitor 13=3pF, the value of the potential Vee=−3.3 volt, the value of the potential Vcc2=0 volt, and the value of the potential Vcc2=0 volt, the fall time of the output signal, which is defined as the time required for the amplitude of the output signal to decay from 90% to 10% of its maximum value and which was 146 psec in the prior art ECL circuitry as shown in FIG. 7, can be reduced to 126 psec. Thus, the fall time of the output of the ECL circuitry can be improved by as much as about 20 psec.

In the above-mentioned embodiments, the terminal a of the discharge switching circuit 20 is connected to the output terminal 3 of the basic unit 19 of the ECL circuit. Generally, when putting the ECL circuit of the present invention to use, the input terminal 1 of the basic unit 19 of the ECL circuit can be connected to the output terminal of another ECL circuit located at the front stage of a series of plural ECL circuits, and the output terminal 3 can be connected to the input terminal of other ECL circuitry located at the back stage. Accordingly, the discharge switching circuit 20 and the threshold potential generating circuit 30 of the present invention can be incorporated into an ECL circuit located at the back stage of a series of plural ECL circuits such that the terminal a of the discharge switching circuit 20 is connected to the input terminal 1 of the basic unit 19 of the other ECL circuit located at the back stage, if a logic circuit located inside or outside a semiconductor integrated circuit including the other ECL circuit located at the front of the ECL circuit including the discharge switching circuit can furnish a control signal, which is synchronized with the charging and discharging of the parasitic capacitor 13 which is parasitic in the output circuit of the other ECL circuit, to the discharge switching circuit 20 of the ECL circuit.

Figure 6:
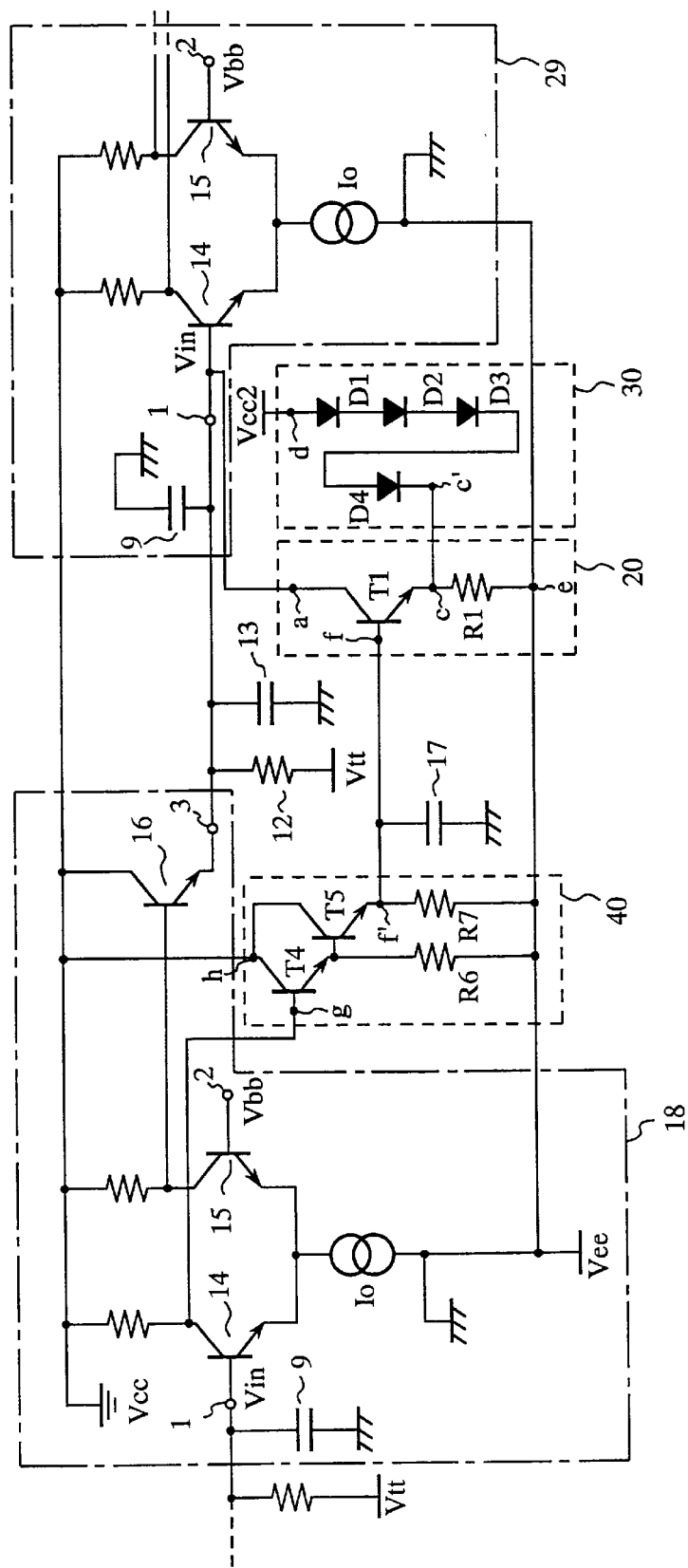
FIG. 6 is a schematic circuit diagram of ECL circuitry according to a fourth embodiment of the present invention.

Referring next to FIG. 6, there is illustrated a schematic circuit diagram of an example of the ECL circuitry provided with a discharge switching circuit 20 incorporated thereinto and connected to the input terminal 1 of the input circuit thereof, and a threshold potential generating circuit 30 supplying a threshold potential to the discharge switching circuit 20. In the figure, the same components as those of the aforementioned ECL circuitry according to the third embodiment are designated by the same reference numerals shown in FIG. 4, and the description about the components will be omitted hereinafter. In FIG. 6, reference numeral 18 denotes a signal source implemented via, for example, the basic unit of an ECL circuit as shown in FIG. 6, 3 denotes an output terminal of the signal source 18, 17 denotes a parasitic capacitor which is parasitic at the terminal f of a level shift circuit 40, and 29 denotes a basic unit of the ECL circuit located at the back of the signal source 18, which can operate in response to an output signal from the signal source 18 located at the front of the ECL circuit.

Thus, according to this embodiment, since the discharge switching circuit 20 is incorporated into the ECL circuitry by connecting the terminal a of the discharge switching circuit 20 to the input terminal 1 of the input circuit of the ECL circuitry rather than the output terminal 3 of the output circuit, it is possible to accelerate the discharge of a charge stored in a parasitic capacitor 9 which is parasitic in the input circuit and a charge stored in the parasitic capacitor 13 which is parasitic in the output circuit of the signal source 18 located at the front of the ECL circuitry. In the example shown in FIG. 6, a distributed constant circuit can be included in two signal lines connected between the signal source 18 and the basic unit 29 of the ECL circuitry located at the back of the signal source 18. While it is therefore needed to conduct a detailed study of counter-measures against a delay of the output of the signal source due to its propagation delay time and the addition of the parasitic capacitor 17, and increases in induction noise, the speeding up of the discharge can increase the operational frequency at which the ECL circuitry acts, and this results in increasing the margin of the fall time of the output signal from the signal source, i.e., the input signal applied to the input terminal 1, with respect to the time constant of the RC circuit located between the output terminal 3 of the signal source 18 and the input terminal 1 of the ECL circuitry located at the back of the signal source 18. In addition, the fall time of the output of the signal source 18 can be further reduced by connecting a further discharge switching circuit to the output circuit of the signal source 18.

As previously explained, the present invention offers the following advantages.

In accordance with a preferred embodiment, there is provided ECL circuitry comprising an output circuit including an output terminal, an emitter follower transistor having an emitter connected to the output terminal, and a load resistor connected between the output terminal and a potential Vtt; a differential amplifier circuit for receiving an input signal and a reference potential Vbb, and for causing the output circuit to charge a parasitic capacitor which is parasitic in the output circuit so that the output of the output circuit makes a transition to its high state, or discharge a charge stored in the parasitic capacitor to the potential Vtt by way of the load resister so that the output of the output circuit makes a transition to its low state, according to whether or not the level of the input signal is larger than the reference potential Vbb; and a discharge switching circuit having a terminal connected to the output circuit and another terminal connected to a negative potential Vee, which can switch to its conductive state in response to a control signal applied thereto so that the charge stored in the parasitic capacitor is also discharged to the negative potential Vee by way of the discharge switching circuit, as well as to the potential Vtt by way of the load resistor, when the output of the output circuit makes a transition from its high state to its low state. Accordingly, the time necessary for discharging a charge stored in the parasitic capacitor in the output circuit of the ECL circuitry can be reduced, and therefore the margin of the discharge time with respect to the time constant of the RC circuit of the output circuit can be increased. As a result, the operational frequency at which the ECL circuitry operates can be increased, and the acceptable parasitic capacitance in the output circuit of the ECL circuitry can be increased.

In accordance with a preferred embodiment of the present invention, the ECL circuitry further comprises a threshold potential generating circuit connected to a potential Vcc (or Vcc2) and the negative potential Vee, for applying the threshold potential which is between the potential Vcc (or Vcc2) and the negative potential Vee to the discharge switching circuit. Furthermore, the discharge switching circuit can switch to its conductive state according to a difference between the level of the control signal and the threshold potential. The threshold potential generating circuit can provide a certain threshold potential for the discharge switching circuit. The level of the control signal can be easily set to a predetermined value which depends on the threshold potential provided by the threshold potential generating circuit. Thus, this embodiment can provide an advantage of facilitating the utilization of the discharge switching circuit.

In accordance with another preferred embodiment of the present invention, there is provided ECL circuitry comprising: an input circuit which can be connected to an output terminal of a signal source located at the front of the ECL circuitry and having a load resistor connected between the output terminal and an potential Vtt, the input circuit including an input terminal; and a discharge switching circuit having a terminal connected to the input circuit and another terminal connected to a negative potential Vee, which can switch to its conductive state in response to a control signal applied thereto so that a charge stored in a parasitic capacitor parasitic at the output terminal of the signal source and a charge stored in a parasitic capacitor parasitic in the input circuit are also discharged to the negative potential Vee by way of the discharge switching circuit, as well as to the potential Vtt by way of the load resistor of the signal source, when an input signal applied to the input terminal of the input circuit makes a transition from its high state to its low state. Accordingly, the time necessary for discharging a charge stored in the parasitic capacitor in the input circuit of the ECL circuitry and a charge stored in the parasitic capacitor in the output circuit of the signal source located at the front of the ECL circuitry can be reduced, and therefore the margin of the discharge time with respect to the time constant of the RC circuit located between the input circuit of the ECL circuitry and the output circuit of the signal source can be increased. As a result, the operational frequency at which the ECL circuitry operates can be increased, and the acceptable parasitic capacitance which is parasitic between the input circuit of the ECL circuitry and the output circuit of the signal source located at the front of the ECL circuitry can be increased.

Furthermore, according to another preferred embodiment of the present invention, the threshold potential generating circuit includes a series circuit comprised of at least either a plurality of diodes biased forward and connected in series with each other or a plurality of resistors, a first terminal connected to the potential Vcc (or Vcc2) and said series circuit, and a second terminal connected to the negative potential Vee and the series circuit, and a transistor having its base connected to somewhere in the series circuit, an emitter connected to the discharge switching circuit for applying the threshold potential to the discharge switching means, and a collector connected to the first terminal. Accordingly, the threshold potential can be stabilized and hence the operating point of the discharge switching circuit can be stabilized by the threshold potential generating circuit. This embodiment of the present invention thus can offer an advantage of being able to easily set the level of the control signal to a predetermined value which depends on the stable and certain threshold potential provided by the threshold potential generating circuit.

Many widely different embodiments of the present invention may be constructed without departing from the spirit and scope of the present invention. It should be understood that the present invention is not limited to the specific embodiments described in the specification, except as defined in the appended claims.

What is claimed is:

1. Emitter coupled logic (ECL) circuitry comprising:

an output means including an output terminal, an emitter-follower transistor having an emitter connected to said output terminal, and a load resistor connected between said output terminal and a potential Vtt;

a differential amplifier means for receiving an input signal and a reference potential Vbb, and for causing said output means to charge a parasitic capacitor which is parasitic in said output means so that the output of said output means makes a transition to its high state, or discharge a charge stored in the parasitic capacitor to the potential Vtt by way of said load resistor so that the output of said output means makes a transition to its low state, according to whether or not the level of the input signal is larger than the reference potential Vbb; and a discharge switching means having a terminal connected to said output means and another terminal connected to a negative potential Vee, which can switch to its conductive state in response to a control signal from outside the ECL circuitry applied thereto so that the charge stored in the parasitic capacitor is also discharged to the negative potential Vee by way of said discharge switching means, as well as to the potential Vtt by way of said load resistor, when the output of said output means makes a transition from its high state to its low states;

wherein said discharge switching means includes a resistor connected to the negative potential Vee, and a third terminal connected to said discharge switching means for receiving a threshold potential, and said discharge switching means can switch to its conductive state according to a difference between the level of the control signal and the threshold potential, so that the charge stored in the parasitic capacitor is also discharged to the negative potential Vee by way of said resistor of said discharge switching means.

2. The ECL circuitry according to claim 1, further comprising a level shift means for shifting the level of a logic signal applied thereto from inside or outside said ECL circuitry to generate and furnish the control signal to said discharge switching means.

3. The ECL circuitry according to claim 1, wherein said discharge switching means includes a transistor having a collector connected to the emitter of said emitter-follower transistor, a base for receiving the control signal, and an emitter connected to said resistor and said third terminal of said discharge switching means.

4. The ECL circuitry according to claim 1, wherein said ECL circuitry further comprises a threshold potential generating means connected to a potential Vcc (or Vcc2) and the negative potential Vee, for applying the threshold potential which is between the potential Vcc (or Vcc2) and the negative potential Vee to said third terminal of said discharge switching means.

5. The ECL circuitry according to claim 4, wherein said threshold potential generating means includes a series circuit comprised of at least either a plurality of diodes biased forward and connected in series with each other or a plurality of resistors, a first terminal connected to the potential Vcc (or Vcc2) and said series circuit, and a second terminal connected to the negative potential Vee and said series circuit, and a transistor having a base connected to somewhere in said series circuit, an emitter connected to said third terminal of said discharge switching means for applying the threshold potential to said third terminal of said discharge switching means, and a collector connected to said first terminal.

6. The ECL circuitry according to claim 4, wherein said threshold potential generating means comprises a series circuit comprised of at least a plurality of diodes biased forward and connected in series with each other, a first terminal connected to the potential Vcc (or Vcc2) and said series circuit, and a second terminal connected to said third terminal of said discharge switching means and said series circuit, for applying the threshold potential to said third terminal of said discharge switching means.

7. The ECL circuitry according to claim 5, wherein the base of said transistor is connected to between one resistor and another resistor of said series circuit, or between one resistor and one diode of said series circuit.

8. Emitter coupled logic (ECL) circuitry comprising:

an input means which can be connected to an output terminal of a signal source located at the front of said ECL circuitry and having a load resistor connected between the output terminal and a potential Vtt, said input means including an input terminal; and a discharge switching means having a terminal connected to said input means and another terminal connected to a negative potential Vee, which can switch to its conductive state in response to a control signal from outside the ECL circuitry applied thereto so that a charge stored in a parasitic capacitor parasitic at the output terminal of the signal source and a charge stored in a parasitic capacitor parasitic in said input means are discharged to the negative potential Vee by way of said discharge switching means, as well as to the potential Vtt by way of said load resistor of the signal source, when an input signal applied to said input terminal of said input means makes a transition from its high state to its low state;

wherein said discharge switching means includes a resistor connected to the negative potential Vee, and a third terminal for receiving a threshold potential, wherein said discharge switching means can switch to its conductive state according to a difference between the level of the control signal and the threshold potential, so that the charges stored in the parasitic capacitors are also discharged to the negative potential Vee by way of said resistor of said discharge switching means.

9. The ECL circuitry according to claim 7, wherein said discharge switching means includes a transistor having a collector connected to said input terminal, a base for receiving the control signal, and an emitter connected to said resistor and said third terminal of said discharge switching means.

10. The ECL circuitry according to claim 7, wherein said ECL circuitry further comprises a threshold potential generating means connected to a potential Vcc (or Vcc2) and the negative potential Vee, for applying the threshold potential which is between the potential Vcc (or Vcc2) and the negative potential Vee to said third terminal of said discharge switching means.

11. The ECL circuitry according to claim 10, wherein said threshold potential generating means comprises a series circuit comprised of at least a plurality of diodes biased forward and connected in series with each other, a first terminal connected to the potential Vcc (or Vcc2) and said series circuit, and a second terminal connected to said third terminal of said discharge switching means and said series circuit, for applying the threshold potential to said third terminal of said discharge switching means.

12. The ECL circuitry according to claim 10, wherein said threshold potential generating means includes a series circuit comprised of at least either a plurality of diodes biased forward and connected in series with each other or a plurality of resistors, a first terminal connected to the potential Vcc (or Vcc2) and said series circuit, and a second terminal connected to the negative potential Vee and said series circuit, and a transistor having a base connected to somewhere in said series circuit, an emitter connected to said third terminal of said discharge switching means for applying the threshold potential to said third terminal of said discharge switching means, and a collector connected to said first terminal.

13. The ECL circuitry according to claim 12, wherein the base of said transistor is connected to between one resistor and another resistor of said series circuit, or between one resistor and one diode of said series circuit.

* * * * *